(12) United States Patent
Bauer-Öppinger et al.

(10) Patent No.: US 10,278,280 B2
(45) Date of Patent: Apr. 30, 2019

(54) COMPONENT CARRIER COMPRISING A COPPER FILLED MULTIPLE-DIAMETER LASER DRILLED BORE

(71) Applicant: AT&S (China) Co. Ltd., Shanghai (CN)

(72) Inventors: Nikolaus Bauer-Öppinger, Gramastetten (AT); ZhaoJian Chen, Shanghai (CN); Yucun Dou, Shanghai (CN); Wilhelm Tamm, Salem (DE)

(73) Assignee: AT&S (China) Co. Ltd., Minhang District, Shanghai (CN)

( * ) Notice: Subject to any disclaimer, the term of this patent is extended or adjusted under 35 U.S.C. 154(b) by 0 days.

(21) Appl. No.: 15/418,711

(22) Filed: Jan. 28, 2017

(65) Prior Publication Data
US 2017/0223820 A1 Aug. 3, 2017

(30) Foreign Application Priority Data
Jan. 29, 2016 (CN) .......................... 2016 1 0066877

(51) Int. Cl.
*H05K 1/02* (2006.01)
*H05K 3/42* (2006.01)
(Continued)

(52) U.S. Cl.
CPC .............. *H05K 1/0206* (2013.01); *H05K 1/09* (2013.01); *H05K 1/112* (2013.01); *H05K 1/181* (2013.01); *H05K 3/0026* (2013.01); *H05K 3/42* (2013.01); *H05K 1/0209* (2013.01); *H05K 3/0035* (2013.01); *H05K 2201/096* (2013.01); *H05K 2201/09509* (2013.01); *H05K 2201/09781* (2013.01); *H05K 2201/09827* (2013.01); *H05K 2201/09854* (2013.01); *H05K 2203/107* (2013.01); *H05K 2203/1476* (2013.01)

(58) Field of Classification Search
CPC ........ H05K 1/0206; H05K 1/09; H05K 1/112; H05K 1/113; H05K 1/115; H05K 1/181; H05K 1/0203; H05K 1/0204
See application file for complete search history.

(56) References Cited

U.S. PATENT DOCUMENTS

2010/0307807 A1* 12/2010 Noda ..................... H05K 1/115
174/264
2010/0307809 A1 12/2010 Noda et al.
(Continued)

FOREIGN PATENT DOCUMENTS

WO  WO 99/18633 A1  4/1999

OTHER PUBLICATIONS

European Patent Office, Extended European Search Report, Application No. 17153635.2-1803, dated Jun. 22, 2017.

*Primary Examiner* — Timothy J Thompson
*Assistant Examiner* — Amol H Patel
(74) *Attorney, Agent, or Firm* — Robert A. Blaha; Smith Tempel Blaha LLC

(57) ABSTRACT

A component carrier includes a layer stack formed of an electrically insulating structure and an electrically conductive structure. Furthermore, a bore extends into the layer stack and has a first bore section with a first diameter (D1) and a connected second bore section with a second diameter (D2) differing from the first diameter (D1). A thermally conductive material fills substantially the entire bore. The bore is in particular formed by laser drilling.

17 Claims, 3 Drawing Sheets

(51) Int. Cl.
*H05K 1/11* (2006.01)
*H05K 1/18* (2006.01)
*H05K 3/00* (2006.01)
*H05K 1/09* (2006.01)

(56) References Cited

U.S. PATENT DOCUMENTS

| | | |
|---|---|---|
| 2010/0326712 A1 | 12/2010 | Kondo et al. |
| 2011/0148545 A1* | 6/2011 | Choudhury ............ B32B 37/185 333/185 |
| 2012/0008295 A1 | 1/2012 | Ouchi et al. |
| 2013/0025120 A1 | 1/2013 | Hondo |
| 2013/0146349 A1* | 6/2013 | Lee ........................ H05K 1/115 174/262 |
| 2017/0223819 A1* | 8/2017 | Sun ...................... H05K 1/0203 |

* cited by examiner

COMPONENT CARRIER COMPRISING A COPPER FILLED MULTIPLE-DIAMETER LASER DRILLED BORE

This application claims the benefit of the filing date of Chinese Patent Application No. 201610066877.X filed Jan. 29, 2016, the disclosure of which is hereby incorporated herein by reference.

TECHNICAL FIELD

The invention relates to a component carrier, to a component carrier system and to an electronic device. Furthermore, the invention relates to a method of manufacturing a component carrier.

TECHNOLOGICAL BACKGROUND

Conventionally, printed circuit boards (PCB) functioning as component carriers comprise a plurality of bores which form vias for generating an electrical connection to an electrical component. Additional, the bores are used to provide a heat transfer in order to reduce the risk of overheating.

Each component carrier usually comprises a plurality of vias (bores), for example more than thousand. Hence, it is necessary to provide a high-speed bore forming process in order to manufacture the component carrier in a short manufacturing time. Moreover, very small manufacturing tolerances for the size of the bores are allowed in order to provide a proper connectivity. Hence, the high-speed drilling process must not be only fast but must be also very accurate.

Conventional bores need to have a small diameter such that connection pads are kept small and the bores have enough space in the component carrier. However, small sized bores also have less capacity for the heat transfer.

Modern electronic devices are more tiny and precise with even multiple functions, which means that more electronic components have to be placed on a tighten PCB. In case of a laser drilling process, the tight dimension with more components requires smaller laser vias, higher laser via density, tighter line/space design and a smaller capture pad size of a pad connected to a via. However, a tighter line/space design in a limited area leads to a smaller laser via size and connection diameter. Due to laser energy reflection, when hitting an inner layer target Cu (Copper) pad during laser drilling, an over hang around the via (bore) opening is created. Standard plating technology requires laser formed vias with a small aspect ratio AR (=Length A of bore/opening diameter R of bore) typically around 0.8, because otherwise the risk of plating defects such as inclusion and crack will increase significantly.

When laser vias with smaller connection (pad) diameter are required on a dielectric PCB having a same thickness in order to avoid mis-registration (=laser vias shift to an inner layer pad), the opening diameter of a via would have to be also reduced and therefore higher risk of plating effects is given.

A limited PCB dimension to which more and more electronic components are installed means also a higher heat spread and heat transfer requirement. Around 30% of bores (vias) which may be formed by laser drilling will be connected to a ground land and are dedicated for a heat spread function.

SUMMARY

There may be a need to provide a component carrier which solve the conflict between a small laser via connection diameter requirement because of the need of tight design requirements and bigger laser via open diameter required to allow a reliable plating performance.

According to a first aspect of the present invention, a component carrier is presented. The component carrier comprises a layer stack formed of an electrically insulating structure and an electrically conductive structure. Furthermore, the component carrier comprises a bore extending into the layer stack and having a first bore section with a first diameter and a connected second bore section with a second diameter differing from the first diameter. The component carrier further comprises a thermally conductive material filling substantially the entire bore. The bore may be in particular formed by laser drilling.

In the context of the present application, the term "component carrier" may particularly denote any support structure which is capable of accommodating one or more electronic components thereon and/or therein for providing both mechanical support and electrical connectivity. Exemplary embodiments of the component carrier are described further below.

Furthermore, the bore of the component carrier comprises the first bore hole section with the first diameter and the second bore hole section with the second diameter. The first diameter and the second diameter differ from each other. In an exemplary embodiment, the first bore hole diameter is larger than the second borehole diameter.

For example, by drilling the first bore section and the second bore section by a laser drilling method, the first bore section and the second bore section may have a slightly conical shape. Hence, the first diameter may be defined by an average first diameter which is the arithmetic mean of the diameters of the first bore section, e.g. of the diameter at an opening section of the first bore section and a diameter of the first bore section which is taken at the transition of the first bore section to the transition section and/or to the second bore section. Accordingly, the second diameter may be defined by an average second diameter which is the arithmetic mean of the diameters of the second bore section, e.g. of the diameter at an opening section of the second bore section and a diameter of the second bore section which is taken at the transition of the second bore section to the transition section and/or to the first bore section. Alternatively, the first diameter may denote the opening diameter of the first bore section at the first surface and the second diameter may denote the opening diameter of the second bore section at the second surface.

The bore is filled with the thermally conductive material. Besides the proper thermal conduction properties, the thermally conductive material may also be electrically conducting. In an exemplary embodiment, the thermally conductive material is copper or a copper compound.

For example, a multiple-diameter bore may be formed by a laser drilling process. The laser drilling process may be used to replace e.g. standard single diameter drill bits for mechanical drilling. The bore according to the present invention may be formed by varying the laser via density, the laser beam cross-sectional area and the penetration time for penetrating the layer stack with the laser radiation.

The bore filled with the thermally conductive material may form a via as connection between two or more layers within the layer stack of the component carrier (e.g. a Printed Circuit Board). The via may form a through hole, a blind via or a buried via.

By providing the bore with different diameter according to the present invention, a small diameter target pad size of a pad section made of the thermally conductive material and formed at an exit opening section of the bore, and additionally a better heat transfer by the thermally conductive material within the larger (second) bore section of the bore is achieved.

Overview of the Component Carrier

According to a further exemplary embodiment, the layer stack comprises a first surface and a second surface opposing the first surface, wherein the bore extends between the first surface and the second surface.

According to a further exemplary embodiment, the first bore section extends from the first surface into the layer stack and the second bore section extends from the second surface into the layer stack.

According to a further exemplary embodiment, the thermally conductive material forms a pad section onto the second surface. The pad section may be connected e.g. to a printed circuit board track or the like. Furthermore, the pad section is part of the thermally conductive material which fills the bore so that a via (vertical connection) through the layer stack is formed. The via connects other embedded components and electrically layer structures within the layer stack to the pad. Typically, the pad has a larger diameter than the printed circuit board track.

However, it is possible to form the printed circuit board track and to fill the bore with the thermally conductive material in one operating step. Hence, the pad section has the same size (width) as the printed circuit board track. Hence, a pad-free connection between the printed circuit board track and the via is possible, because no production tolerances are necessary. Hence, a pad-free and so called "landless" (joint free) via-printed circuit board track connection may be provided.

According to a further exemplary embodiment, the thermally conductive material extends along the first surface for forming a heat radiation section. The larger the heat radiation section along the first surface, the larger the heat that may be transported away from the component carrier.

According to a further exemplary embodiment, the heat radiation section forms a first covering area onto the first surface and the pad forms a second covering area onto the second surface. The first covering area is larger than the second covering area.

It is an aim to have smaller pad sections along the second surface so that a plurality of pad sections and hence a plurality of bores can be formed in the component carrier. The more pad sections are formed within the component carrier, the more connection possibilities of the component carrier are given. Hence, the pad sections should be small so that a contact with adjacent pad sections is prevented. On the other side, a large heat radiation section along the first surface is desired so that a proper heat transport away from the component carrier is provided. For example, fewer but larger bores used for heat transfer are formable but still allowing small capture pad sections with a small diameter.

Regarding the size of the heat radiation section, an overhang of the heat radiation section which is defined between a circumference of the heat radiation section and an edge of the first bore section at the first surface is limited in size, because if the overhang exceeds a certain threshold size, the risk of voids, cracks and other plating defects during a plating proceeding, where the thermally conductive material flows into the bores, increases.

According to a further exemplary embodiment the component carrier further comprises a further bore extending into the layer stack. The further bore is spaced apart from the bore, wherein the further bore extends between the first surface and the second surface. The thermally conductive material is filling substantially the entire further bore. The further bore may be formed with a uniform diameter or may be formed according to the bore with different diameter sections as described above.

According to a further exemplary embodiment the thermally conductive material extends along the first surface between the bore and the further bore. Hence, along the first surface, a common heat radiation section for the bore and the further bore may be generated. However, the heat radiation section of the bore may be electrically isolated with respect to the further heat radiation section of the further bore.

According to a further exemplary embodiment, between the first bore section and the second bore section a transition section is formed. In the transition section the first diameter merges into the second diameter. The first diameter is greater than the second diameter. In an exemplary embodiment, the first diameter may be, just as an example, between approximately 50 µm (micrometer) to approximately 300 µm, in particular approximately 70 µm to approximately 150 µm. Accordingly, the second diameter may be, just as an example, between approximately 20 µm to approximately 100 µm, in particular approximately 40 µm to approximately 80 µm.

The transition section may be defined as a section, where the larger diameter reduces and merges to the smaller diameter. The transition section length along a bore axis may be, just as an example, ½ to 1/15 of the total bore length and hence the total thickness of the component carrier. Specifically, the transition section length along the bore axis may be, just as an example, ¼ of the total bore length and hence the total thickness of the component carrier.

According to a further exemplary embodiment, the bore has a slope shape. The bore with the slope shape comprises for example an upper first bore section and a lower second bore section, wherein between the first bore section and the second bore section the transition section is formed.

The first bore section comprises a larger diameter than the second bore section. In particular, the first bore section comprises a slightly conical shape, wherein the first diameter of the first bore section reduces from the opening section of the first bore section at the first surface along the direction to the transition section. In a cross-sectional view of the bore, the walls forming the first bore section may have a curved shape.

The second bore section comprises a smaller diameter than the first bore section. In particular, the second bore section comprises a slightly conical shape, wherein the second diameter of the second bore section reduces from the transition section along the direction to the second opening section of the second bore at the second surface. In a cross-sectional view of the bore, the walls forming the second bore section may have a curved shape.

The transition section comprises a rapidly reducing diameter along the bore axis from the first bore section in the direction to the second bore section. In a cross-sectional view of the bore, the transition section forms an S-shaped run. In an exemplary embodiment, the average diameter of the transition section may be, just as an example, between approximately 15 µm (micrometer) to approximately 200 µm, in particular approximately 30 µm to approximately 100 µm.

In particular, the first bore section and the second bore section comprise a common bore axis. The transition section extends within a plane having a normal, wherein the transition section is formed such that an angle between the normal and the common bore axis is approximately ±35 degree and for example parallel with the common bore axis.

Summarizing, the slope shape of the bore may be literally seen as an onion dome shape.

The slope shape of the bore may be preferably formed by laser drilling, because the slope shape is formable by adapting the laser intensity and the laser line width.

According to a further exemplary embodiment, the first bore section comprises a first aspect ratio which is the ratio between a first length of the first bore section and the diameter of the first bore section at the first surface. The second bore section comprises a second aspect ratio which is the ratio between a second length of the second bore section and the diameter of the second bore section at the second surface. The first aspect ratio is smaller than the second aspect ratio.

An aspect ratio AR is defined by the thickness (length) A of a borehole with respect to an opening diameter R of the bore at a respective surface of the component carrier:

$$AR=A/R$$

The plating capability can be improved by a reduction of aspect ratio AR. Hence, the aspect ratio AR can be reduced by decreasing the length of the bore and/or by increasing the opening diameter R.

Hence, by the above described bore comprising the first bore section having e.g. a larger diameter than the second bore section, the opening diameter R of the first bore section can be increased as well in order to provide a large surface of the heat radiation section, wherein the diameter R of the second bore section is reduced in order to provide a small sized pad section along the second surface.

Furthermore, the first length of the first bore section may be formed larger than the second length of the second bore section in order to provide a proper aspect ratio for both, the first bore section and the second bore section. For example, the first length may have the double length of the second length.

For example, in a mechanically drilled bore having a uniform diameter, a stack layer of a component carrier has a thickness A of 1 mm with 0.1 mm opening diameter R will have an aspect ratio AR=A/R of 10:1=10.

However, preferably the aspect ratio for the first bore section and the second bore section is smaller than approximately 1, more in particular smaller than 0.8. The aspect ratios of the first bore section and the second bore section may differ with respect to each other or may be equal (in particular by adjusting the lengths and widths of both bore section with respect to each other). As can be taken from the exemplary above, the bore according to the present invention comprises the first aspect ratio of the first bore section and the second aspect ratio of the second bore section. Hence, the sum of both aspect ratios may be smaller than the overall aspect ratio of conventional bores.

Summarizing, the overall aspect ratio of the bore is reduced to ease a (copper) plating process. Furthermore, a smaller pad section of the second bore section is formed and the internal stress of the component carrier is reduced and the reliability is improved. Furthermore, it may be in general advantageous to keep the impedance within the component carrier constant. However, constant impedance between conductive parts or lines and vias of the component carrier is difficult. By a smaller diameter (e.g. by the smaller second bore section comprising the second opening diameter), the capacity will be reduced and also the land and pad-size, respectively, may be reduced. As described above, also a "landless" via may be formed. A smaller land or a landless via affects also the capacity and the impedance, respectively. By the interaction of the diameter of the via and the land (pad size), the impedance may be regulated and adjusted, respectively, such that an impedance difference between a conductive line and a via may be compensated. A further advantage may be the reduction of loss. Because the diameter may be reduced, the capacity is reduced as well and thus charging currents are reduced which results in reduced charging currents, respectively.

In particular, by forming the bore with the slope like shape by a laser drilling method, a laser formed via (bore) with a bigger first opening diameter of the first bore section along with a smaller connection diameter (a smaller pad section) of the second bore section can be provided. With the smaller connection diameter, a precise registration performance on a critical capture pad can be achieved. At the same time, the bigger opening diameter allows a smaller aspect ratio AR which will be beneficial for a plating process. Hence, the bigger first opening diameter provides a bigger heat spread area (i.e. the heat radiation section) which means that the amount of laser vias which are only used for heat transport may be reduced, because the required heat transfer capacity can be provided by the vias (bores) formed according to the present invention which are also used for electrical connectivity and additionally for providing a larger heat transfer capacity.

Summarizing, by the differently sized for sections, a proper aspect ratio limitation for the copper filling process is given and a tight/small target pad annular ring breakout is prevented. Furthermore, the total volume of copper (functioning as the thermally conductive material) in the filled via (bore) for better heat transfer is increased. Hence, less heat remains in the via which causes lower temperature and less expansion of the layer stack. This results in less stress and a better reliability of the component carrier.

According to a further exemplary embodiment the at least one electrically insulating (layer) structure comprises at least one of the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide. Although prepreg or FR4 are usually preferred, other materials may be used as well.

In an embodiment, the at least one electrically conductive (layer) structure comprises at least one of the group consisting of copper, aluminum, and nickel. Although copper is usually preferred, other materials are possible as well.

In an embodiment, the component carrier is shaped as a plate. This contributes to the compact design of an electronic device, wherein the component carrier nevertheless provides a large basis for mounting electronic components thereon. Furthermore, in particular a naked die as preferred example for an embedded electronic component, can be conveniently embedded, thanks to its small thickness, into a thin plate such as a printed circuit board.

In an embodiment, the component carrier is configured as one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier having substantially the same size as an electronic component to be mounted thereon.

In an embodiment, the component carrier is a laminate-type component carrier. In such an embodiment, the component carrier is a compound of multiple layer structures which are stacked and connected together by applying a pressing force, if desired accompanied by heat.

According to a further exemplary embodiment an electronic device comprising an electronic component with electric terminals and an above described component carrier in which the electronic component is packaged.

In an embodiment, the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. For example, a magnetic element can be used as an electronic component. Such a magnetic element may be a permanent magnetic element (such as a ferromagnetic element, an antiferromagnetic element or a ferromagnetic element, for instance a ferrite core) or may be a paramagnetic element. However, other electronic components, in particular those who generate and emit electromagnetic radiation and/or are sensitive with regard to electromagnetic radiation propagating to the electronic component from an environment, may be embedded in the electronic device.

According to a further aspect of the present invention, a component carrier system is described, which comprises an above described component carrier and a further above described component carrier. The component carrier is arranged onto the further component carrier such that the second bore section of the component carrier abuts onto the further first bore section of the further component carrier.

According to a further exemplary embodiment of the system, the second bore section of the bore of the component carrier and the second bore section of the further bore of the further component carrier are facing one another while the first bore section of the bore of the component carrier and the first bore section of the further bore of the further component carrier are opposing one another.

According to a further exemplary embodiment of the system, the second bore section of the bore of the component carrier and the second bore section of the further bore of the further component carrier are laterally displaced relative to one another.

According to a further exemplary embodiment, the system further comprises a high density layer structure arranged between and electrically and/or thermally coupled with the second bore section of the bore of the component carrier and the second bore section of the further bore of the further component carrier on opposing main surfaces of the high density layer structure.

According to a further exemplary embodiment of the system, the high density layer structure is a single layer structure or a multiple layer structure.

According to a further exemplary embodiment of the system, the electronic component is packaged in a high density layer structure of the component carrier system. By arranging the respective second bore sections of the bore and the further bore at the high density layer structure, a high density of packaging and at the same time a good heat transfer away from the high density layer structure is provided.

According to a further aspect of the present invention, a method of manufacturing a component carrier is described. According to the method, a layer stack of an electrically insulating structure and an electrically conductive structure is formed. A bore extending into the layer stack is bored, wherein the bore has a first bore section with a first diameter and a connected second bore section with a second diameter differing from the first diameter. Substantially the entire bore is filled with a thermally conductive material. In particular, the bore is drilled by a laser drilling device.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DETAILED DESCRIPTION OF ILLUSTRATED EMBODIMENTS

Figure 1:
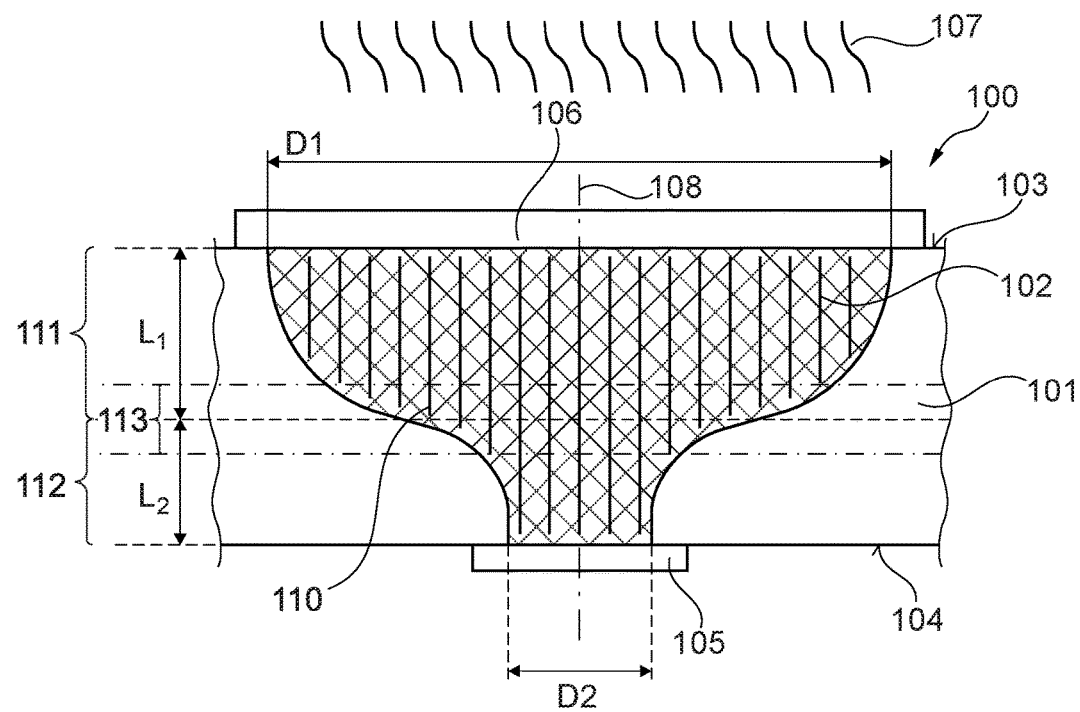
FIG. 1 shows a schematic view of a component carrier comprising a bore with a slope shape according to an exemplary embodiment of the present invention.

The invention will be described in more detail hereinafter with reference to examples of embodiment but to which the invention is not limited.

The illustrations in the drawings are schematical. In different drawings, similar or identical elements are provided with the same reference signs.

FIG. 1 illustrates a component carrier 100 into which an electrical component can be embedded or mounted thereon. The component carrier 100 comprises a layer stack 101 formed of an electrically insulating structure and an electrically conductive structure and a bore 110 extending into the layer stack 101 and having a first bore section 111 with a first diameter D1 and a connected second bore section 112 with a second diameter D2 differing from the first diameter D1. The component carrier 100 further comprises a thermally conductive material 102 filling substantially the entire bore 110. The bore 110 is in particular formed by laser drilling. In the exemplary embodiment shown in FIG. 1, the first borehole diameter D1 is larger than the second borehole diameter D2.

The bore 110 is filled with the thermally conductive material 102. Besides the proper thermal conduction properties, the thermally conductive material 102 may also be electrically conducting. In an exemplary embodiment, the thermally conductive material 102 is copper or a copper compound.

The bore 110 filled with the thermally conductive material 102 may form a via as connection between two or more layers within the layer stack 101 of the component carrier 100. By providing the bore 110 with different diameters D1+D2, a small diameter target pad size of a pad section 105 made of the thermally conductive material 102 and formed at an exit section of the bore 110 and additionally a better heat transfer by the thermally conductive material 102 within the larger second bore section 112 of the bore is achieved.

For example, by drilling the first bore section 111 and the second bore section 112 by a laser drilling method, the first bore section 111 and the second bore section 112 may have a slightly conical shape. Hence, the first diameter D1 may be defined by an average first diameter D1 which is the arithmetic mean of the diameters of the first bore section 111, e.g. of the diameter at an opening section of the first bore section 111 and a diameter of the first bore section 111 which is taken at the transition of the first bore section 111 to the transition section 113 and/or to the second bore section 112. Accordingly, the second diameter D2 may be defined by an average second diameter which is the arithmetic mean of the diameters of the second bore section 112, e.g. of the diameter at an opening section of the second bore section 112 and a diameter of the second bore section 112 which is taken at the transition of the second bore section 112 to the transition section 113 and/or to the first bore section 111.

The layer stack 101 comprises a first surface 103 and a second surface 104 opposing the first surface 103, wherein the bore 110 extends between the first surface 103 and the second surface 104. The first bore section 111 extends from the first surface 103 into the layer stack 101 and the second bore section 112 extends from the second surface 104 into the layer stack 101.

The thermally conductive material 102 forms a pad section 105 onto the second surface 104. The pad section 105 may be connected e.g. to a printed circuit board track. Furthermore, the pad section 105 is part of the thermally conductive material 102 which fills the bore 110 so that a via (vertical connection) through the layer stack 101 is formed. The via connects other embedded components and electrically layer structures within the layer stack 101 to the pad section 105. Typically, the pad section 105 has a larger diameter than the printed circuit board track. However, it is possible to form the printed circuit board track and to fill the bore 110 with the thermally conductive material 102 in one operating step. Hence, the pad section 105 size may be reduced and has the same size (width) as the printed circuit board track.

The thermally conductive material 102 extends along the first surface 103 for forming a heat radiation section 106. The larger the heat radiation section 106 along the first surface 103, the larger the heat 107 that may be transported away from the component carrier 100. The heat radiation section 106 forms a first covering area onto the first surface 103 and the pad section 105 forms a second covering area onto the second surface 104. The first covering area is larger than the second covering area.

Regarding the size of the heat radiation section 106, the overhang section 301 (see FIG. 3) of the heat radiation section 105 which is defined between a circumference of the heat radiation section 105 and an edge of the first bore section 111 at the first surface 103 is limited in size, because if the overhang section 301 exceeds a certain threshold size, the risk of voids, cracks and other plating defects during a plating proceeding, where the thermally conductive material 102 flows into the bores 110, increases.

The diameter for calculating the aspect ratio may be the diameter of a respective opening section of respective bore sections 111, 112 or the above described average diameter of the respective bore sections 111, 112.

As can be taken from FIG. 1, the first bore section 111 comprises a larger diameter D1 than the second diameter D2 of the second bore section 112. In particular, the first bore section 111 comprises a slightly conical shape, wherein the first diameter D1 of the first bore section 111 reduces from the opening section of the first bore section 111 at the first surface 103 along the direction to the transition section 113. The circumferential area of the conical first bore section 111 may have a slightly curved shape.

The second bore section 112 comprises a smaller diameter D2 than the first bore section 111. In particular, the second bore section 112 comprises a slightly conical shape, wherein the second diameter D2 of the second bore section 112 reduces from the transition section 113 along the direction to the second opening section of the second bore 112 at the second surface 104. The circumferential area of the conical second bore section 112 may have a slightly curved shape.

The transition section 113 comprises a strong reducing diameter along the bore axis 108 from the first bore section 111 in the direction to the second bore section 112. In a cross-sectional view as shown in FIG. 1, the transition section forms an S-shaped run.

In particular, the first bore section 111 and the second bore section 112 comprise a common bore axis 108. The transition section 113 extends within a plane having a normal, wherein the transition section is formed such that an angle between the normal and the common bore axis 108 is approximately ±35 degree and for example parallel with the common bore axis 108. Summarizing, the slope shape of the bore 110 may be literally seen as an onion dome shape.

The first bore section 111 comprises a first aspect ratio which is the ratio between the first length L1 of the first bore section 111 and the diameter D1 (opening diameter) of the first bore section 110 at the first surface 103. The second bore section 112 comprises a second aspect ratio which is the ratio between a second length L2 of the second bore section 112 and the diameter D2 (opening diameter) of the second bore section 112 at the second surface 104. The first aspect ratio may be smaller than the second aspect ratio.

The bore 110 shown in FIG. 1 is designed such that the first bore section 111 having e.g. a larger diameter D1 than the second bore section 112. The opening diameter R (D1) of the first bore section 111 is increased in order to provide a large surface area 301 of the heat radiation section 106, wherein the diameter R (D2) of the second bore section 112 is reduced in order to provide a small sized pad section 105 along the second surface 104.

Furthermore, the first length L1 of the first bore section 111 is formed larger than the second length L2 of the second bore section 112 in order to provide a proper aspect ratio AR for both, the first bore section 111 and the second bore section 112. For example, the first length L1 may have the double length of the second length L2.

The first length L1 is defined as the length from the first surface 103 along the bore axis 108 to the transition section 113. The second length L2 is defined as the length from the second surface 104 along the bore axis 108 to the transition section 113. Half of the transition section length is assigned to the first length L1 and the other half of the transition section length is assigned to the second length L2.

In particular, by forming the bore 110 with the slope like shape as shown in FIG. 1 by a laser drilling method, a laser formed via (bore 110) with a bigger first opening diameter D1 of the first bore section 111 along with a smaller connection diameter D2 (a smaller pad section) of the second bore section 112 can be provided. With the smaller connection diameter D2, a precise registration performance on a critical capture pad 105 can be achieved. At the same time, the bigger opening diameter D1 of the first bore 110 allows a smaller aspect ratio AR which will be beneficial for a plating process. Hence, the bigger first opening diameter D1 provides a bigger heat spread area (i.e. the heat radiation section 106).

Figure 2:
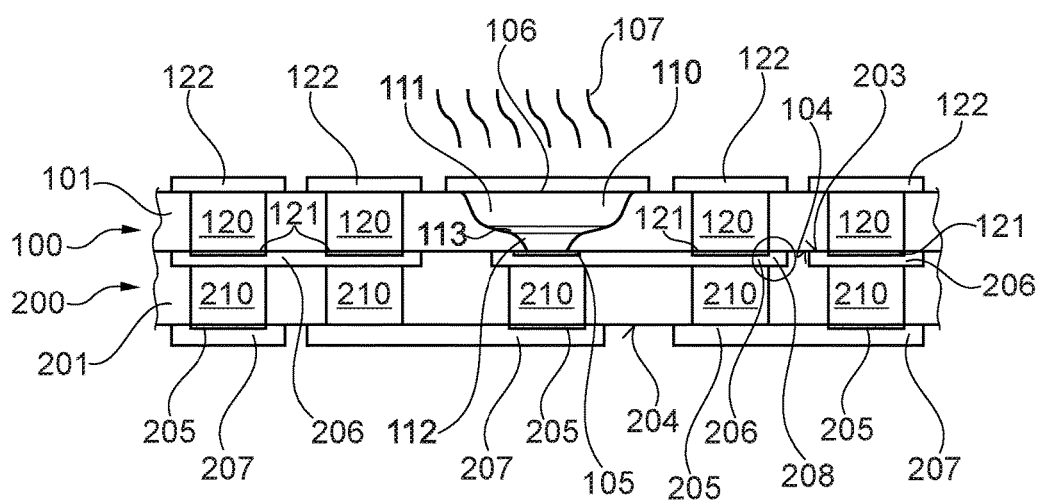
FIG. 2 shows a schematic view of a component carrier having a bore according to the present invention which is arranged onto a further component carrier.

FIG. 2 shows a schematic view of a component carrier 100 having a bore 110 according to the present invention which is arranged onto a further component carrier 200. Alternatively, reference numerals 100 and 110 in FIG. 2 may denote two layers of one and the same board.

The component carrier 100 comprises the bore 110 as shown in FIG. 1. In particular, the component carrier 100 comprises a layer stack 101 formed of an electrically insulating structure and an electrically conductive structure and a bore 110 extending into the layer stack 101 and having a first bore section 111 with a first diameter D1 and a connected second bore section 112 with a second diameter D2 differing from the first diameter D1. The component carrier further comprises a thermally conductive material 102 filling substantially the entire bore 110. The bore 110 is in particular formed by laser drilling. In the exemplary embodiment shown in FIG. 1, the first bore hole diameter D1 is larger than the second borehole diameter D2.

Furthermore, as shown in FIG. 2, the first bore section comprises a large heat radiation section 106, so that heat 107 is transferred away from the component carrier 100.

Furthermore, the component carrier 100 comprises further bores 120 which are arranged adjacent to the bore 110. The further bores 120 are shown in a conventional uniform or slightly conical design. As can be taken from FIG. 2, the further pad sections 121 of the further bores 120 and the further heat radiation sections 122 of the further bores 120 comprise almost a similar sized area, because due to the large opening diameters of the further bores 120 smaller further pad sections 121 are not possible. Furthermore, larger further heat radiation sections 122 are also not easy to manufacture due to plating process requirements.

Furthermore, as can be seen in FIG. 2, the component carrier 100 is arranged onto a further component carrier 200. The further component carrier 200 comprises further bores 210 which are filled with a thermally and electrically conductive material. The further bores 210 may be drilled by a laser drilling or mechanical drilling method. The further bores 210 comprise a further heat radiation section 206 onto which the pad section 105, 121 of the respective bores 110, 120 of the component carrier 100 are arranged and in electrical and thermal contact, respectively. Accordingly, the further heat radiation section 206 is formed along a further first surface 203 of the further layer stack 201. The further heat radiation section 206 may comprise thermally conductive material connecting two adjacent further bores 210. The further bores 210 may comprise respective further pad sections 205 which are formed along a further second surface of the further layer stack 201. The further pad sections 205 are in contact with a contact layer 207, which is arranged onto the further layer stack 201.

As can be taken from FIG. 2, the further bores 210 of the further component carrier 200 comprise a uniform or conical shape, so that the further heat radiation section 206 and the further pad section 205 have almost the same size. In particular, the further heat radiation section 206 of the further component carrier 200 comprise almost the same size as the further pad section 121 of the further bore 120 of the component carrier 100. Hence, as a high risk of mis-registration 208, which is a pad section shift of the further pad section 121 and the respective further heat radiation section 206 of the further bore 210 of the further component carrier 200. In particular, the mis-registration 208 describes a shift of the further bore 120 of the component carrier 100 with respect to the further bore 210 of the further component carrier 200, such that the thermally conductive material within the further bore 120 forms an overhang with respect to the thermally conductive material within the further bore 210 of the further component carrier 200. The mentioned overhang of the mis-registration 108 is highlighted within the circle drawn in FIG. 2. Hence, by reducing the pad section 105 of the bore 110 according to the present invention, the risk of mis-registration 108 is reduced.

Figure 3:
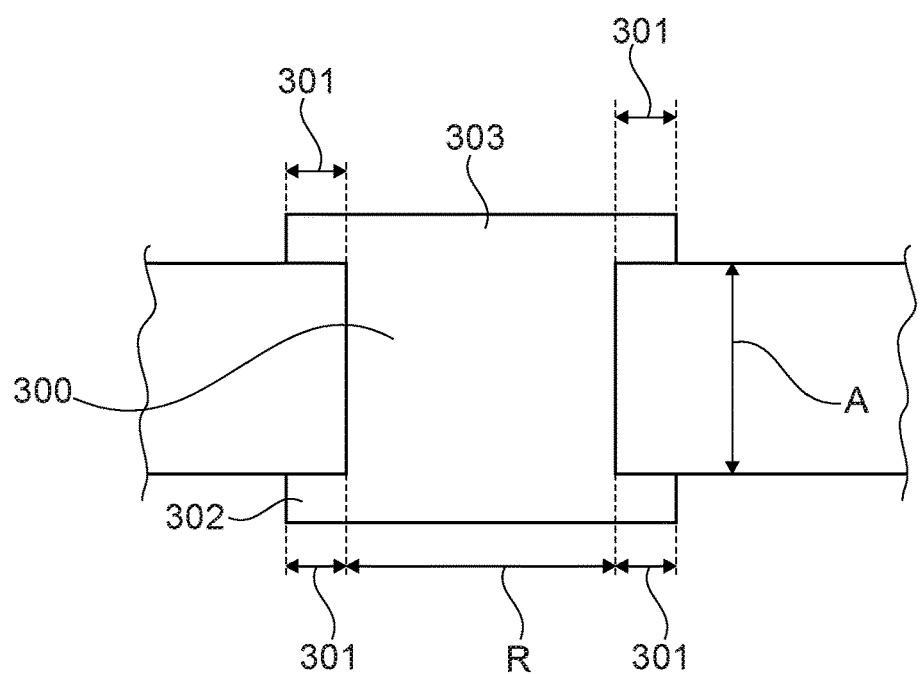
FIG. 3 shows a schematic view of a bore for describing the definition of the aspect ratio.

FIG. 3 shows a schematic view of a bore for describing the definition of the aspect ratio AR. An aspect ratio AR is defined by the thickness (length) A of a bore 300 with respect to an opening diameter R of the bore 300 at a respective surface of a component carrier:

$$AR=A/R$$

The plating capability can be improved by a reduction of aspect ratio AR. Hence, the aspect ratio AR can be reduced by decreasing the length of the bore 300 and/or by increasing the opening diameter R.

For example, a stack layer of a component carrier has a thickness A (which is the bore length) 50 μm (Micrometer) and an opening diameter R of the bore 300 of 60 μm (Micrometer) such that an aspect ratio AR=A/R of 50:60=0.8 is given. The mentioned values of the thickness relate to a printed circuit board as component carrier. A skilled person will recognize that smaller thickness values are appropriate for a substrate as component carrier.

Regarding the size of the heat radiation section 303, an overhang 301 of the heat radiation section 303 which is defined between a circumference of the heat radiation section 303 and an edge of the bore section at the first surface is limited in size, because if the overhang 301 exceeds a certain threshold size, the risk of voids, cracks and other plating defects during a plating proceeding, where the thermally conductive material flows into the bores, increases.

Accordingly, an overhang 301 of a connection section 302 (pad section) which is defined between a circumference of the connection section 302 and an edge of the bore section at the first surface is limited in size.

Figure 4:
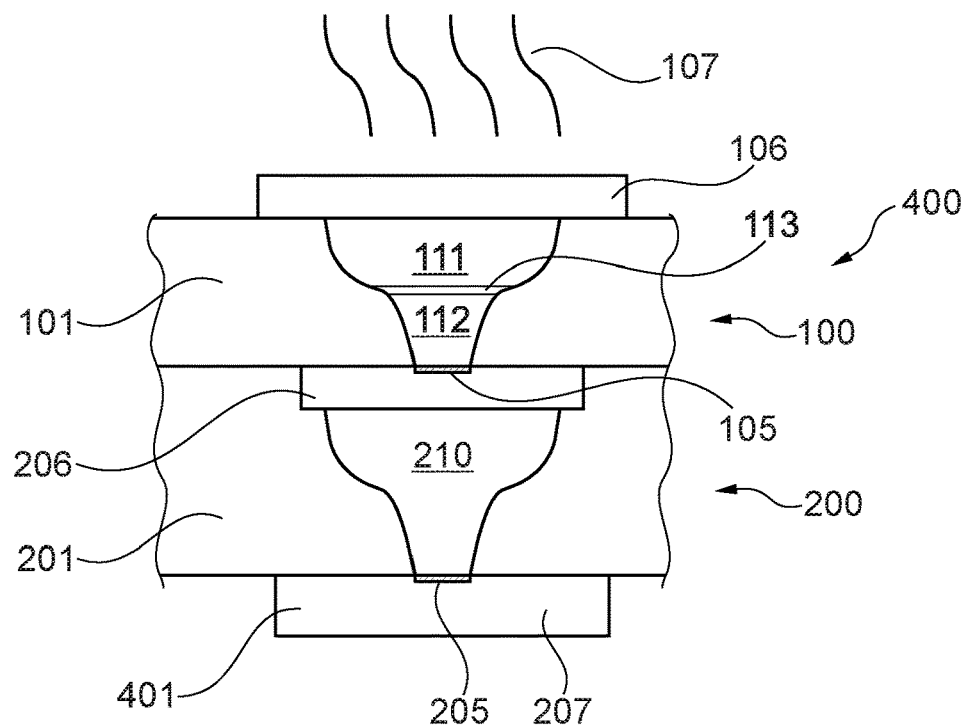
FIG. 4 shows a schematic view of a component carrier system according to an exemplary embodiment of the present invention.

FIG. 4 shows a schematic view of a component carrier system 400 according to an exemplary embodiment of the present invention. The component carrier system 400 comprises an above described component carrier 100 and a further above described component carrier 200. Alternatively, reference numerals 100 and 200 in FIG. 4 may denote two layers of one and the same board. The component carrier 100 is arranged onto the further component carrier 200 such that the second bore section 112 of the component carrier 100 abuts onto the further first bore section of the further component carrier 200. In particular, the pad section 105 abuts onto the further heat radiation section 206 of the further bore 210. Specifically, both, the bore 110 of the component carrier 100 and the further bore 210 of the further component carrier 200 are formed similar to the bore 110 is shown in FIG. 1.

Hence, the bores 110, 210 have larger heat radiation sections 106, 206 in comparison to their respective pad sections 105, 205. Hence, proper plating characteristics are given and the risk of mis-registration is reduced.

Figure 5:
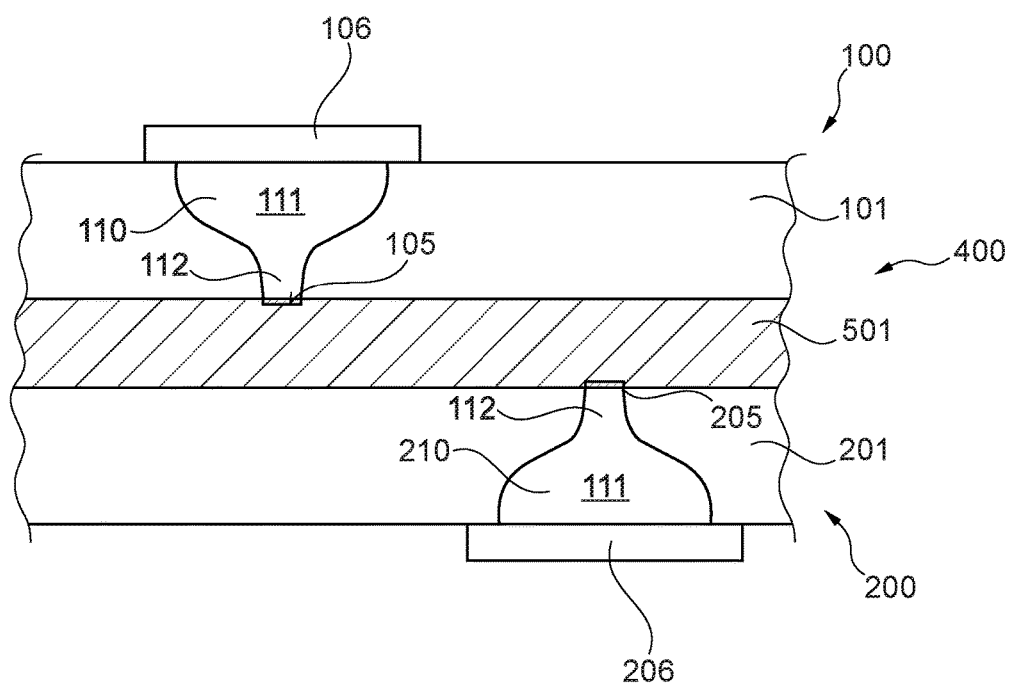
FIG. 5 shows a schematic view of a further component carrier system according to an exemplary embodiment of the present invention.

FIG. 5 shows a schematic view of a further component carrier system 400 according to an exemplary embodiment of the present invention. The component carrier system 400 comprises an above described component carrier 100 and a further above described component carrier 200. Alternatively, reference numerals 100 and 200 in FIG. 5 may denote two layers of one and the same board.

A high density layer 501 is arranged between the component carrier 100 and the further component carrier 200. The second bore section 112 of the bore 110 abuts on the first surface of the high-density layer 501 and the second bore section 112 of the further bore 210 abuts on a second surface of the high-density layer 501, wherein the first surface is an opposite side with respect to the second surface of the high-density layer 501. In other words, the high-density layer 501 is arranged between the second bore section 112 of the bore 110 and the second bore section of the further bore 210. In particular, a first pad section 105 of the bore 110 abuts on the first surface of the high-density layer 501 and a further pad section 205 of the further bore 210 abuts on the second surface of the high-density layer 501. The second bore section 112 of the bore 110 of the component carrier 100 and the second bore section 112 of the further bore 210 of the further component carrier 200 are facing one another while the first bore section 111 of the bore 110 of the component carrier 100 and the first bore section 111 of the further bore 210 of the further component carrier 200 are opposing one another.

Furthermore, as can be taken from FIG. 5, the second bore section 112 of the bore 110 of the component carrier 100 and the second bore section 112 of the further bore 210 of the further component carrier 200 are laterally displaced relative to one another. By arranging the respective second bore sections 112 of the bore 110 and the further bore 210 at the high density layer structure 501, a high density of packaging and at the same time a good heat transfer away from the high density layer structure 501 is provided.

It should be noted that the term "comprising" does not exclude other elements or steps and the "a" or "an" does not exclude a plurality. Also elements described in association with different embodiments may be combined. It should also be noted that reference signs in the claims shall not be construed as limiting the scope of the claims. Implementation of the invention is not limited to the preferred embodiments shown in the figures and described above. Instead, a multiplicity of variants are possible which use the solutions shown and the principle according to the invention even in the case of fundamentally different embodiments.

REFERENCE SIGNS

| | |
|---|---|
| 100 | component carrier |
| 101 | layer stack |
| 102 | thermally conductive material |
| 103 | first surface |
| 104 | second surface |
| 105 | pad section |
| 106 | heat radiation section |
| 107 | heat radiation |
| 108 | bore axis |
| 110 | bore |
| 111 | first bore section |
| 112 | second bore section |
| 113 | transition section |
| 120 | further bore |
| 121 | further pad section |
| 122 | further heat radiation section |
| 200 | further component carrier |
| 201 | further layer stack |
| 203 | further first surface |
| 204 | further second surface |
| 205 | further pad section |
| 206 | further heat radiation section |
| 207 | contact layer |
| 210 | further bore of further component carrier |
| 300 | bore |
| 301 | overhang section |
| 302 | connection section |
| 303 | heat radiation section |
| 400 | component carrier system |
| 501 | high density layer structure |
| D1 | first diameter |
| D2 | second diameter |
| L1 | first length |
| L2 | second length |
| R | opening diameter of bore |
| A | thickness of component carrier |

The invention claimed is:

1. A component carrier system, comprising:
   a component carrier formed from
      a layer stack of an electrically insulating structure and an electrically conductive structure,
      a bore extending into the layer stack having a first bore section with a first diameter and a connected second bore section with a second diameter differing from the first diameter with a thermally conductive material in the bore,
   a further component carrier arranged according to the component carrier,
   wherein the component carrier is arranged onto the further component carrier such that the second bore section of the component carrier abuts onto a respective second bore section of the further component carrier, and
   a high density layer structure arranged between and electrically and/or thermally coupled with the second bore section of the bore of the component carrier and the second bore section of the further bore of the further component carrier on opposing main surfaces of the high density layer structure.

2. The component carrier system according to claim 1, wherein the second bore section of the bore of the component carrier and the second bore section of the further bore of the further component carrier are facing one another while the first bore section of the component carrier and the first bore section of the further component carrier are opposing one another.

3. The component carrier system according to claim 1, wherein the second bore section of the bore of the component carrier and the second bore section of the further bore of the further component carrier are laterally displaced relative to one another.

4. The component carrier system according to claim 1, wherein the high density layer structure is a single layer structure or a multiple layer structure.

5. The component carrier system according to claim 1, wherein the layer stack comprises a first surface and a second surface opposing the first surface, and
wherein the bore extends between the first surface and the second surface.

6. The component carrier system according to claim 5, wherein the first bore section extends from the first surface into the layer stack and the second bore section extends from the second surface into the layer stack.

7. The component carrier system according to claim 6, wherein the thermally conductive material forms a pad section onto the second surface.

8. The component carrier system according to claim 7, wherein the thermally conductive material extends along the first surface for forming a heat radiation section.

9. The component carrier system according to claim 8, wherein the heat radiation section forms a first covering area onto the first surface and the pad section forms a second covering area onto the second surface,
wherein the first covering area is larger than the second covering area.

10. The component carrier system according to claim 5, wherein the component carrier further comprises:
a further bore extending into the layer stack,
wherein the further bore is spaced apart from the bore,
wherein the further bore extends between the first surface and the second surface, and
wherein the thermally conductive material substantially fills the entire further bore.

11. The component carrier system according to claim 10, wherein the thermally conductive material extends along the first surface between the bore and the further bore.

12. The component carrier system according to claim 5, wherein the first bore section comprises a first aspect ratio defined by a first length of the first bore section and the diameter of the first bore section at the first surface,
wherein the second bore section comprises a second aspect ratio defined by a second length of the second bore section and the diameter of the second bore section at the second surface, and
wherein the first aspect ratio is smaller than the second aspect ratio.

13. The component carrier system according to claim 1, wherein the first diameter of the first bore section is larger than the second diameter of the second bore section,
wherein between the first bore section and the second bore section a transition section is formed,
wherein in the transition section the first diameter merges into the second diameter,
wherein the bore has a slope shape,
wherein bore is formed by laser drilling,
wherein the at least one electrically insulating structure comprises at least one of the group consisting of resin, cyanate ester, glass, prepreg material, polyimide, liquid crystal polymer, epoxy-based Build-Up Film, FR4 material, a ceramic, and a metal oxide,
wherein the at least one electrically conductive structure comprises at least one of the group consisting of copper, aluminum, and nickel, and
wherein the component carrier is shaped as a plate.

14. The component carrier system according to claim 1, wherein the component carrier is configured as one of the group consisting of a printed circuit board, and a substrate.

15. The component carrier system according to claim 1, wherein the component carrier is a laminate-type component carrier.

16. An electronic device, comprising:
an electronic component with electric terminals,
a component carrier including:
 a layer stack formed of an electrically insulating structure and an electrically conductive structure;
 a bore extending into the layer stack and having a first bore section with a first diameter and a connected second bore section with a second diameter differing from the first diameter; and
 a thermally conductive material filling the bore; and
a component carrier system including a further component carrier,
wherein the component carrier is arranged onto the further component carrier such that the second bore section of the component carrier abuts onto the further first bore section of the further component carrier in which the electronic component is packaged,
wherein the electronic component is packaged in a high density layer structure of the component carrier system.

17. The electronic device according to claim 16, wherein the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, and a logic chip.

* * * * *